United States Patent
Long et al.

(10) Patent No.: US 6,314,852 B1
(45) Date of Patent: Nov. 13, 2001

(54) GANG PUNCH TOOL ASSEMBLY

(75) Inventors: David C. Long, Wappingers Falls; John U. Knickerbocker, Hopewell Junction; Mark J. LaPlante, Walden; Thomas Weiss, Poughquag; Robert P. Westerfield, Jr., Montgomery, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/128,447

(22) Filed: Aug. 3, 1998

(51) Int. Cl.[7] .................................................. B26F 1/00
(52) U.S. Cl. ........................ 83/623; 83/529; 100/219; 100/264; 100/281
(58) Field of Search .................. 100/281, 219, 100/264; 83/623, 152, 529, 530, 62

(56) References Cited

U.S. PATENT DOCUMENTS

| | | | |
|---|---|---|---|
| 557,018 | * 3/1896 | Philipp | 83/623 |
| 2,784,665 | * 3/1957 | Georgeff | 100/282 |
| 2,855,999 | * 10/1958 | Novak | 83/530 |
| 3,156,971 | * 11/1964 | De Shazor, Jr. | 100/264 |
| 3,174,377 | * 3/1965 | Lischer | 83/530 |
| 3,225,686 | * 12/1965 | Clements | 83/530 |
| 3,241,187 | * 3/1966 | Nouel | 100/219 |
| 3,333,447 | * 8/1967 | Alspaugh | 83/529 |
| 3,392,613 | * 7/1968 | Johns | 83/623 |
| 3,640,167 | * 2/1972 | Axtmann | 83/623 |
| 3,656,392 | * 4/1972 | Krynytzky et al. | 83/530 |
| 3,667,891 | * 6/1972 | Gelin | 100/219 |
| 3,724,308 | * 4/1973 | Nichols | 83/623 |
| 4,123,956 | 11/1978 | Harvey . | |
| 4,167,435 | * 9/1979 | Olschewski | 100/281 |
| 4,390,771 | 6/1983 | Kurtz et al. . | |
| 4,425,829 | 1/1984 | Kranik et al. . | |
| 4,558,619 | 12/1985 | Caumont . | |
| 4,653,365 | * 3/1987 | Takasaki et al. | 83/50 |
| 4,674,372 | 6/1987 | Mobley . | |
| 4,872,381 | 10/1989 | Stroms . | |
| 5,024,127 | 6/1991 | Mueller et al. . | |
| 5,090,282 | * 2/1992 | Ruesch | 83/530 |
| 5,090,284 | 2/1992 | Nakajima . | |
| 5,136,905 | 8/1992 | Stack et al. . | |
| 5,214,991 | * 6/1993 | Shimizu et al. | 83/168 |
| 5,233,895 | 8/1993 | Coneski et al. . | |
| 5,431,329 | 7/1995 | Hasegawa et al. . | |
| 5,852,970 | * 12/1998 | Bornhorst et al. | 100/264 |
| 6,006,638 | * 12/1999 | Eltringham | 83/152 |

OTHER PUBLICATIONS

"Punch Programming Mechanism", A.F. Coneski, et al., IBM Technical Disclosure Bulletin, vol. 26, No. 10A, Mar. 1984.

"Gang Punch For Soft Workpieces", E.S. Pearson, IBM Technical Disclosure Bulletin, vol. 19, No. 4, Sep. 1976.

"'Air Spring' Programmable Via Punching Head", J.R. Kranik and W.F. Mueller, IBM Technical Disclosure Bulletin, vol. 16, No. 12, May 1974.

"Progressive Gang Punch", J.R. Kranik and B.C. O'Neill, IBM Technical Disclosure Bulletin, vol. 15, No. 2, Jul. 1972.

* cited by examiner

Primary Examiner—Kenneth E. Peterson
Assistant Examiner—Stephen Choi
(74) Attorney, Agent, or Firm—DeLio & Peterson, LLC; John J. Tomaszewski; Tiffany L. Townsend

(57) ABSTRACT

A gang punch tool assembly and method is provided for punching holes in a plurality of greensheets which are processed sequentially through the assembly. The punch mechanism is a gang punch cooperating with a corresponding die and the greensheet is automatically fed to the gang punch and die, the greensheet punched and then the punched greensheet removed from the punch area and another greensheet positioned for punching. Operation of the gang punch apparatus is efficient and effective and has a high greensheet throughput. A preferred gang punch uses a pressurizable air chamber for controlling punching of the greensheet without damage to the greensheets or gang punch mechanism.

8 Claims, 8 Drawing Sheets

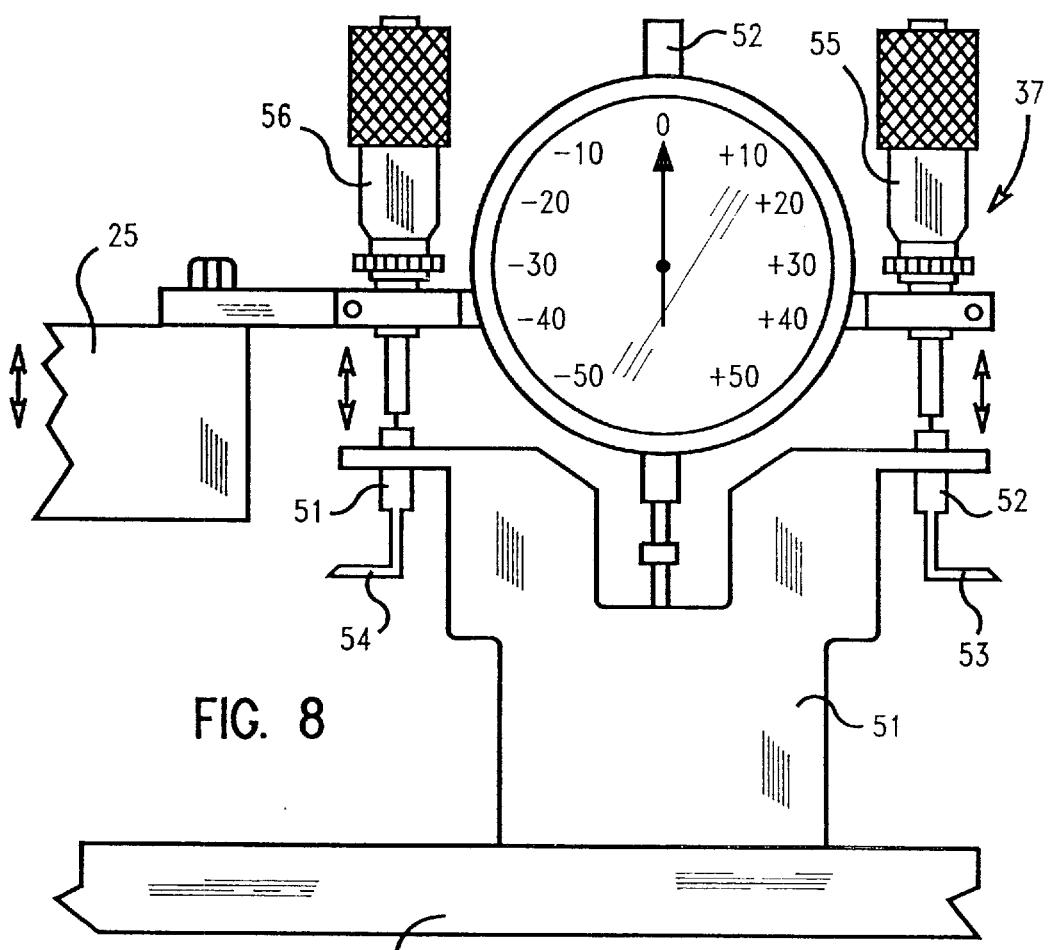
FIG. 8
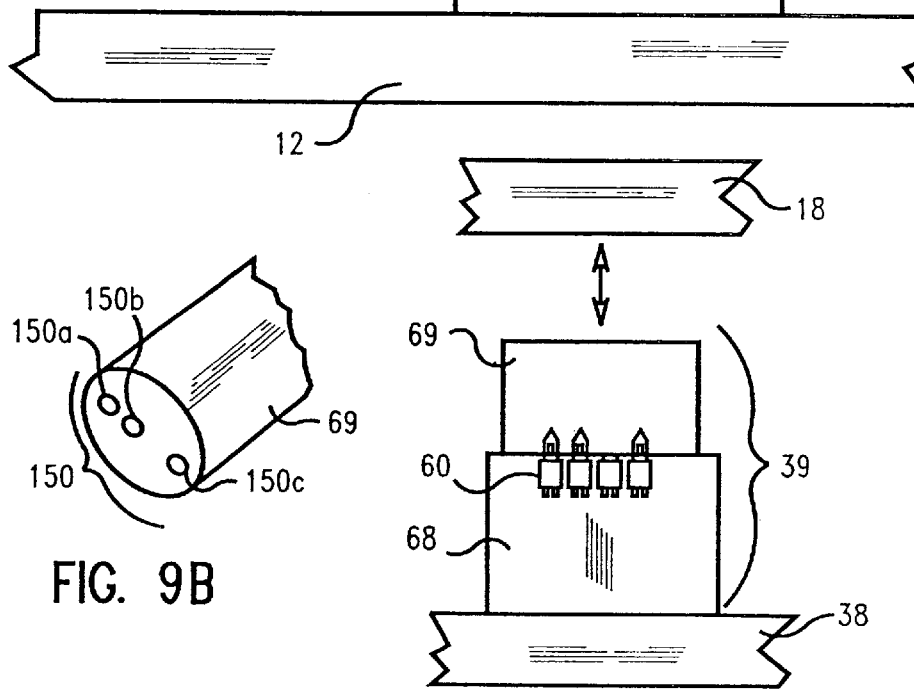
FIG. 9B
FIG. 9A

GANG PUNCH TOOL ASSEMBLY

CROSS-REFERENCE TO RELATED APPLICATIONS

Aspects of the present invention are related to subject matter disclosed in co-pending applications entitled Apparatus and Method for Producing Punch Pin with Spherical Head and Low-Cost High-Density Gang Punch both co-pending applications filed on even date herewith and both assigned to the same assignee as the present invention.

BACKGROUND OF THE INVENTION

1. Field of the Invention

This invention relates to a gang punch tool assembly for punching holes in thin sheet material and, more particularly, to an automated tool assembly for punching a plurality of greensheets in succession comprising a gang punch containing a plurality of punches in a fixed pattern and which gang punch is programmable to activate certain punches to form holes in a desired hole pattern in the greensheets using a die corresponding with the gang punch, the greensheets being automatically fed one by one to the gang punch and die, the greensheet punched, and the punched greensheet then removed and another greensheet positioned for punching.

2. Description of Related Art

In the manufacture of multilayer ceramic (MLC) substrates for integrated circuit semiconductor package structures, a plurality of green ceramic sheets (commonly termed greensheets) are formed by doctor blading a slurry containing a resin binder, a particulate ceramic material, solvents and a plasticizer, drying the doctor bladed sheet and cutting it into appropriate size sheets. Through holes, commonly termed vias, are then punched in the greensheets to facilitate forming electrical interconnections through the sheet when metallized. Electrically conductive paste is deposited in the holes and in appropriate patterns on the surface of the greensheets, the sheets stacked and laminated, and the assembly subsequently fired at a sintering temperature.

The formation of the vias in the ceramic material is accomplished in its green state. Prior to being fired, the greensheets are easily deformed and the precision with which the via holes are formed is greatly dependent upon the use of an apparatus which minimizes distortion or disruption to the structural integrity of the greensheet other than forming the via hole. With the size of electrical components constantly being reduced through technical improvement, the positioning of the vias in ceramic greensheets is becoming ever more restrictive. Further, with the increase in the quantity of the electronic circuits that may be positioned and packaged on a small area of the ceramic substrate, a requirement for a larger number of via holes in the greensheet is evident.

Large numbers of holes must be punched into a greensheet with a high degree of precision in order to properly position the holes. At the same time, this punching operation must occur very rapidly in order to produce the large numbers of greensheets that are necessary in the mass production of electronic components.

A significant portion of the costs associated in manufacturing ceramic packages can be attributed to punching vias in greensheets. A number of factors play a major role in accounting for these costs such as: 1) the high cost for punch die sets customized to a specific product; 2) the long lead-time associated with punch die set fabrication precludes early introduction of a new product; 3) non-customized automated punch die sets have very low through-put for a non-grid product; and 4) automated punch/die sets punches step/repeat numerous times to punch a single sheet resulting in low throughput.

One method for punching greensheets is using a gang-punching apparatus. A gang-punch is a punch/die set where all the punches for a particular ceramic greensheet layer are rigidly and permanently mounted in a fixed plate. The gang-punch is used to punch the entire sheet (layer) with a single stroke. A gang-punch has very high throughput and is cost effective for very high volume products.

Unfortunately, the use of a gang-punch apparatus has drawbacks since the fabrication of dedicated gang-punches with fixed patterns of via holes are not practical for products requiring engineering changes (E.C.'s) or multiple patterns because the same apparatus cannot be easily modified to form different via hole patterns in ceramic greensheets having a different via pattern thereby requiring separate gang-punch apparatus for each E.C. or pattern desired. Additionally, the turn-around time for a new gang-punch/die set is lengthy and high via density is unattainable with single punch heads and usually require multiple punch heads with staggered punches to punch tight grids. The cost is also prohibitive for the punches since for a typical pattern (up) that is specified nine (9) times on each greensheet (9-up) and with each pattern having 2000 (or more) vias, such a 9-up layer would require a gang punch apparatus with a total of 18,000 punches. For a multilayer ceramic substrate composed of ten (10) layers, with each layer requiring a separate gang punch apparatus with 18,000 punches, 180,000 punches would be required to populate these apparatus. At a typical cost of $1 per punch, it would cost $180,000 for the punches alone. Current technology limits for single stroke gang-punching is a minimum punch spacing of about 16 mils.

A number of attempts have been made to provide a gang-punch apparatus which will economically and efficiently provide the means to make via openings in greensheets. One type apparatus utilizes an interposer mask which contains hole openings where holes are desired to be punched. In these apparatus, a plurality of punch elements arranged in a grid are positioned over the greensheet which is covered by the interposer mask. When the punch elements contact the interposer mask as the punch heads are moved downwardly, the holes will be punched where the openings occur since the punch element would pass through the openings in the interposer mask and through the ceramic greensheet. In other areas covered by the interposer mask, i.e., where holes are not desired, the interposer mask will cause the punch element to be retracted into the punch head. Such apparatus are shown in IBM Technical Disclosure Bulletins, Vol. 16, No. 12, May 1974; Vol. 19, No. 4, September 1976 and Vol. 26, No. 10A, March 1984. Other punch apparatus are 5,090,284; and 5,233,895. In U.S. Pat. No. 4,872,381, supra, for example, a programmable magnetic repulsion punching apparatus is shown. A progressive gang-punch is shown in IBM Technical Disclosure Bulletin Vol. 15, No. 2, July 1972 wherein a gang-punch is shown utilizing steel balls on the surface of the punch head at locations of punches to be punched which when a roller traverse the top of the punch head only vias are punched where steel balls are located. The disclosures of the above references and patents are hereby incorporated by reference.

Regardless of the gang punch/die apparatus used, it is equally important to process multiple greensheets rapidly, effectively and efficiently using the apparatus. This requires moving and positioning greensheets to be punched in the gang punch/die apparatus, removing the punched greensheet and then moving and positioning another greensheet for punching. This process is repeated and it is important that each greensheet be processed rapidly without any damage to the greensheet and that the greensheet be properly aligned for punching.

Bearing in mind the problems and deficiencies of the prior art, it is therefore an object of the present invention to provide a gang-punch tool assembly for rapidly punching hole patterns sequentially in a plurality of thin sheet materials such as greensheets.

It is a further object of the present invention to provide a method for punching via holes in greensheets which are sequentially processed rapidly through the gang punch tool assembly apparatus of the invention.

It is another object of the present invention to provide greensheets and other thin sheet materials punched using the method and apparatus of the invention.

Other objects and advantages of the present invention will be readily apparent from the following description.

SUMMARY OF THE INVENTION

The above and other objects and advantages, which will be apparent to one of skill in the art, are achieved in the present invention which is directed to, in a first aspect, a gang punch tool assembly comprising:

structural means for carrying a gang punch apparatus which gang punch is actuatable to force punch pins in the apparatus through openings in a die mated with the punch apparatus, a die apparatus, a thin worksheet (e.g. greensheet) feeder device and a punched worksheet (e.g. greensheet) removal device;

reciprocating means to move the die apparatus upwards to mate with the punch apparatus and downward to be separated from the punch apparatus;

means to actuate the gang punch apparatus when the die is mated with the gang punch to force the punch pins in the punch apparatus outward from the apparatus to enter corresponding openings in the die mated with the punch apparatus.

In a further aspect of the invention, the gang punch tool assembly comprises a punch apparatus which is secured to a punch press platen movable up and down in the assembly. In the greensheet punching position, the punch press platen is fixedly secured in the assembly. The punch press platen is preferably fixedly secured in the assembly by wedge shaped locking blocks, movable laterally in the assembly to lock the press platen in a fixed position. The greensheet feeder device and greensheet removal device are preferably vacuum devices which pick up a greensheet from a stack of greensheets to be punched and deliver the individual greensheet to the punch position. After punching, the greensheet removal device is moved over the punched greensheet and preferably by vacuum removes the punched greensheet from the die and moves it to an output station. Another greensheet is then picked up and delivered to the punch position.

It is a preferred feature of the invention that a gang punch apparatus be used which has an expandable pressure chamber which when actuated allows the punch pins to move outward from the apparatus into corresponding openings of a mating die apparatus. Such an apparatus is shown in a patent application filed on even date herewith entitled Low-Cost High-Density Gang Punch assigned to the assignee of the present invention, now U.S. Pat. No. 6223636. Punch pins for use in the gang punch apparatus are preferably made as described in an application filed on even date herewith entitled Apparatus And Method For Producing Punch Pins With Spherical Head assigned to the assignee of the present invention.

A pressure chamber is used between guide and stripper plates of the gang punch apparatus to enable the plates to be in an extended non-punching position or a contracted punching position. The pressure chamber may be expanded or contracted depending on the gas pressure within the chamber and the force of a die apparatus mated with the gang punch. The gang punch apparatus in the non-punching position will have air or other gas within the chamber under pressure so that the punch pins are disposed within the guide and stripper plates of the gang punch apparatus. When the apparatus is to be used, the air pressure in the chamber is vented or reduced so that a force exerted on the gang punch apparatus by the die will force the lower stripper plate toward the upper guide plate extending the desired punch pins below the lower surface of the stripper plate into the die and the non-punch pins into the through holes of the clearance plate. After the punching operation, air will be forced into the chamber, expanding the chamber and, once again, stripping or retracting the punches out of the die and punched greensheet and positioning all the punch pins within the guide and stripper plates of the gang-punch apparatus.

A method for punching greensheets is also provided comprising:

supplying a stack of greensheets to be punched;

moving a single greensheet into a gang punch tool assembly comprising:

structural means for carrying a punch apparatus which gang punch is actuatable to force punch pins in the apparatus through openings in a die mated with the punch apparatus, a die apparatus, a greensheet feeder device and a punched greensheet removal device;

reciprocating means to move the die apparatus upward to mate with the punch apparatus and downward to separate from the punch apparatus; and means to actuate the gang punch apparatus when the die is mated with the gang punch to force the punch pins in the punch apparatus outward from the apparatus to enter the corresponding openings in the die mated with the punch apparatus;

moving a greensheet to the top of the die apparatus;

moving the die apparatus upwards to mate with the punch apparatus;

controlling air in the pressure chamber of the punch apparatus to a low value to allow the punch pins in the punch apparatus to pass through corresponding openings in the die thereby punching the greensheet interposed between the gang punch apparatus and die apparatus;

increasing controlled pressure in the pressure chamber of the gang punch apparatus to remove punch pins in the gang punch apparatus from the die apparatus and punched greensheet;

moving the die apparatus to a position separated from the below the gang punch apparatus;

removing the punched greensheet using the punched greensheet removal device; and repeating the above steps to punch a plurality of greensheets.

In another aspect of the invention, greensheets and other thin sheet materials which have been punched using the method and apparatus of the invention are provided.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 8 is a side elevational view of an air pressure controller used to control air pressure in the pressure chamber in the gang punch.

FIG. 9A is a side elevational view of the punch platen and a punch platen stop used in the tool assembly.

FIG. 9B is a perspective view of a removable stop block used to control the height of the punch platen.

DESCRIPTION OF THE PREFERRED EMBODIMENT(s)

Figure 1:
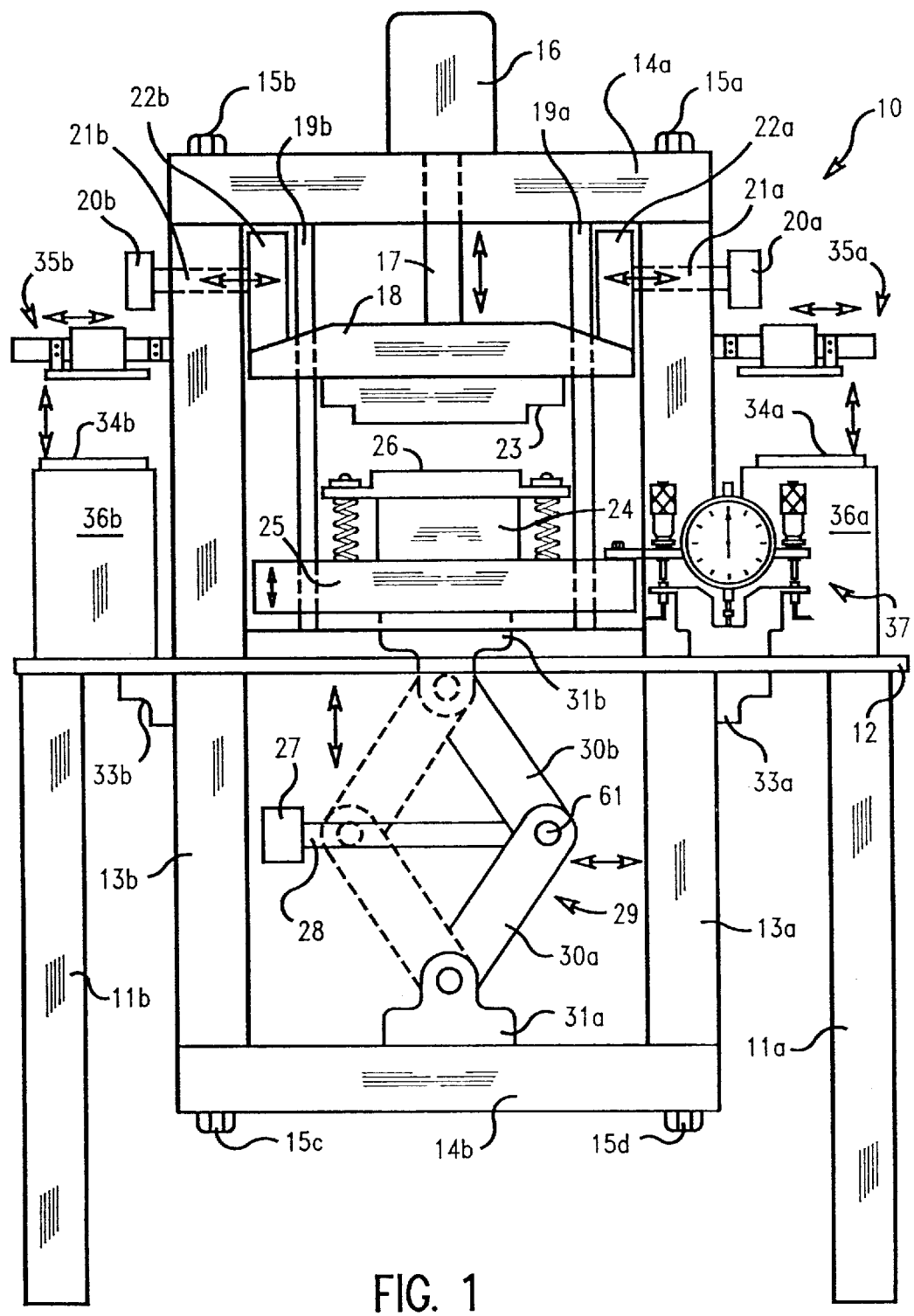
FIG. 1 is a side elevational view of a gang punch tool assembly apparatus of the invention.

In describing the preferred embodiment of the present invention, reference will be made herein to FIGS. 1–10 of the drawings in which like numerals refer to like features of the invention. Features of the invention are not necessarily shown to scale in the drawings.

Referring to FIG. 1, the gang punch assembly apparatus of the invention is shown generally as 10. The apparatus 10 comprises a table having vertical legs 11a and 11b (other legs not shown) and a top 12 to carry various support structures and having openings therein as discussed below. The top 12, for example, has an opening centrally positioned for movement of the die platen mechanism as described further hereinbelow. A box-shaped support structure is defined by vertical members 13a and 13b (the other two members not shown) and connected horizontal cross members 14a and 14b (the other two horizontal cross members not shown). Bolts 15a, 15b, 15c and 15d (the other four not shown) secure the structure together.

A punch platen cylinder 16 is disposed at the upper end of horizontal member 14a of the support structure and has a connected piston rod 17 which moves vertically in an extended or retracted portion relative to the cylinder 16 as shown by the arrows. The free end of the piston rod 17 is connected to punch platen 18. The punch platen 18 has through openings near the ends thereof to allow movement of the platen along vertical fixed punch/die guide rods 19a and 19b (guide rods 19c and 19d not shown). The fixed guide rods extend from the upper horizontal member 14a to a guide rod support structure 38 secured to the top 12 of the table.

Figure 2A:
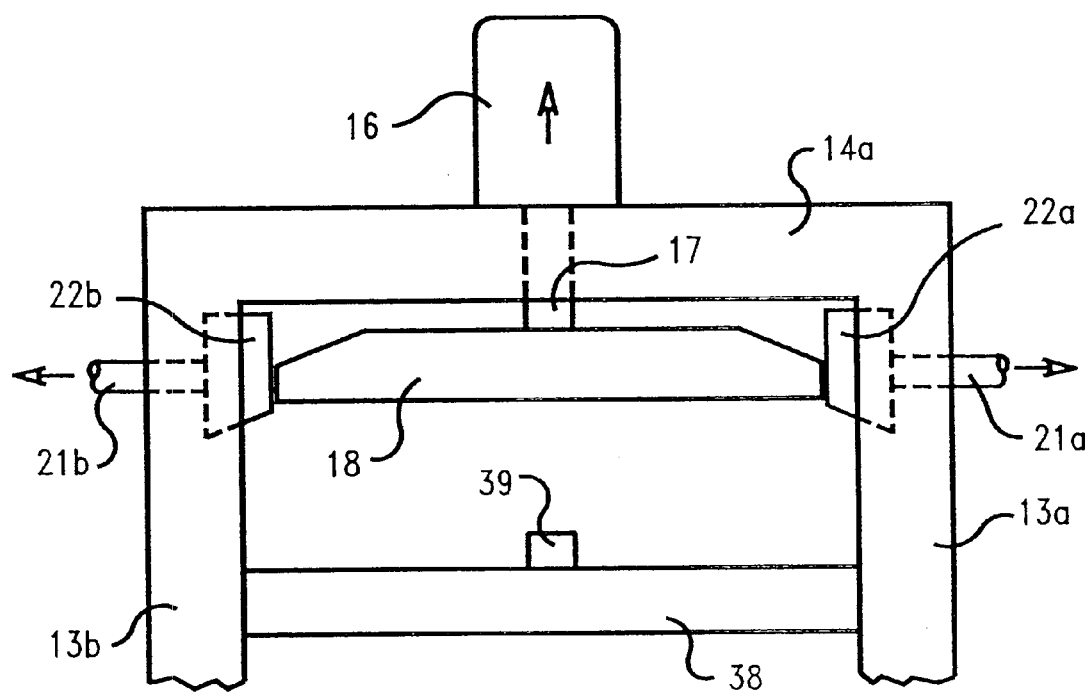
FIGS. 2A–2B is a side elevational view of a punch platen assembly of the gang punch tool assembly apparatus of the invention in the greensheet receiving position and the greensheet punching position.
Figure 2B:
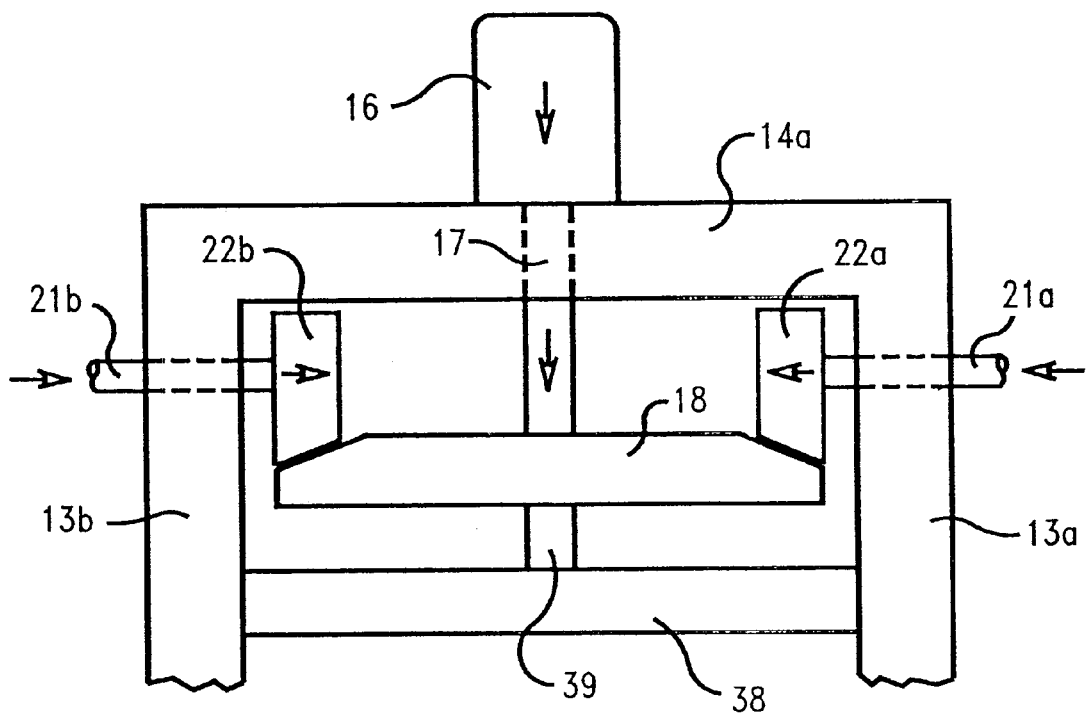

Locking block cylinders 20a and 20b each having movable piston rods 21a and 21b respectively are connected at the free end of the rods to locking blocks 22a and 22b. When the locking blocks cylinders are actuated, the piston rods move horizontally in the direction of the arrows to lock the punch platen in the desired punch position or release the punch platen for upward movement to remove a punched greensheet and the feeding of a new greensheet to the punch area. The distance the punch platen 18 moves is controlled by stop 39 (not shown) in FIG. 1 for clarity) as shown in FIGS. 2A and 2B and 9.

A gang punch 23 is secured to lower surface of punch platen 18 and moves vertically when punch platen cylinder 16 is actuated. An opposed die 24 is secured to die platen 25. The die platen 25 also moves vertically on guide members 19a and 19b by movement of the die moving knuckle assembly shown generally as 29. Attached to the lower surface of die platen 25 is a clevis flange member 31b for rotatably connecting knuckle member 30b thereto. A similar clevis flange 31a is attached to the upper surface of lower horizontal member 14b for rotably connecting knuckle member 30a thereto. A knuckle assembly cylinder 27 has a piston rod 28 which moves horizontally in and out of the cylinder and the free end of which is fixedly connected to a pin 61 rotatably connecting the free ends of knuckle members 30a and 30b. As can be seen, knuckle members 30a and 30b are rotatable relative to each other and to support members 31a and 31b. As will be further discussed hereinbelow, movement of knuckle rod piston rod 28 moves knuckle members 30a and 30b in a reciprocating vertical movement which in turn moves connected die platen 25 in a corresponding reciprocating vertical motion.

A greensheet feeder is shown generally as 35b and the feeder moves in and out of the punch area as shown by the arrows. Greensheets 34b supported on input table 36b are lifted one at a time by the greensheet feeder 35b and moved to the right into the punch area. Once the greensheet is punched, the punched greensheet removal device shown generally as 35a moves into the punch area and picks up the punched greensheet. The punched greensheet receiver 35a then moves out of the punch area and deposits the punched greensheet on output table 36a. A greensheet aligner shown generally as 26 is shown in a movable but restrained position on top of die 24 to facilitate accurate positioning of the greensheet for punching.

Table supports 33a and 33b (other supports not shown) attach the bottom of top 12 and horizontal member 13a and 13b to provide stability of the table against movement of the assembly during the punching operation.

A pressure controller shown generally as 37 is used to control pressure in the expandable chamber of the preferred gang punch apparatus used in the tool assembly. The pressure controller controls the pressure in the gang punch apparatus during punching and after punching to facilitate punching and removal of the punch from the die and greensheet without tearing or otherwise damaging the punched greensheet.

Referring now to FIGS. 2A and 2B, use of the punch platen 18 of the invention may be demonstrated. In FIG. 2A the punch platen 18 is fixedly connected to the free end of piston rod 17 of cylinder 16. The punch platen 18 will move vertically up and down as shown by the arrows when the piston rod 17 is moved by the cylinder. FIG. 2A shows the punch platen 18 in position ready for the introduction of a greensheet to be punched into the punching area of the apparatus. In this position, the piston rod 17 is retracted in cylinder 16 and the punch platen is near horizontal member 14a. Two of four punch platen locking blocks 22a and 22b are shown fixedly connected to the free end of piston rods 21a and 21b respectively. The piston rods are each connected to a cylinder which, when actuated, moves the locking blocks 22a and 22b horizontally as shown by the arrows. A cross-member 38 between vertical supports 13a and 13b has a punch platen stop block 39 disposed thereon. The block may be adjustable as described hereinbelow and it functions to limit the distance the punch platen 18 can be moved.

In FIG. 2B, the punch platen 18 is shown extended by extended piston rod 17 into a punching position. Locking blocks 22a and 22b are likewise extended by extended piston rods 21a and 21b to engage the upper tapered surface of punch platen 18. The engagement locks the punch platen 18 in a fixed unmovable position for punching. As it can be seen, the upper surface of locking blocks 22a and 22b are constrained from vertical movement by the lower surface of horizontal member 14a and the lower surface of blocks 22a and 22b are in a locked position with the upper surface of punching platen 18. It will be appreciated that if the punch platen stop block 39 was higher or lower that the punch platen 18 would be correspondingly locked in a higher or lower position. This higher or lower position facilitates punching of different thickness greensheets by changing the height of stop block assembly 39 and will be more fully discussed hereinbelow in relation to FIG. 9.

Figure 3A:
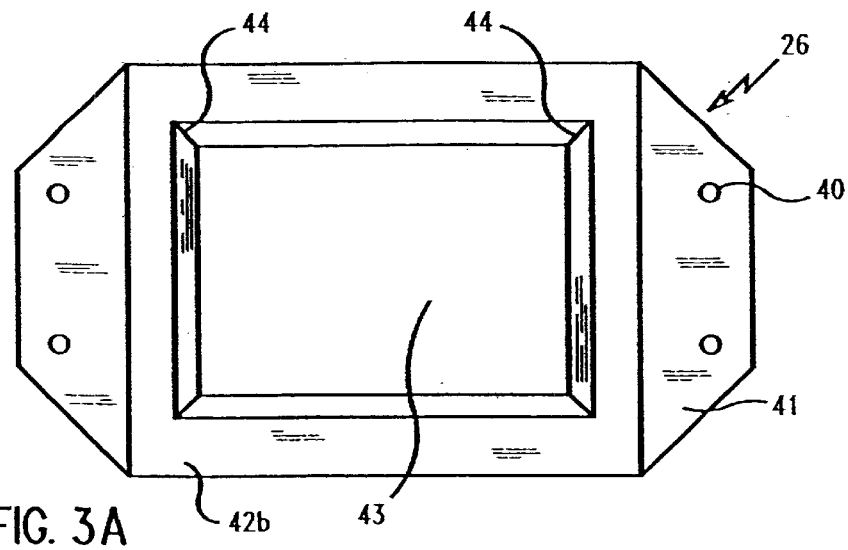
FIG. 3A is a top plan view of a greensheet aligning plate used in the gang punch tool assembly of the invention.
Figure 3B:
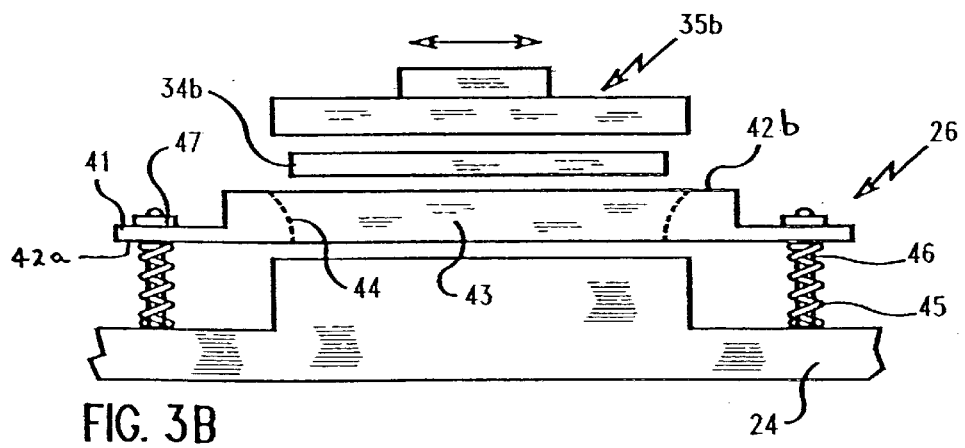
FIGS. 3B–3D are side elevational views of the greensheet aligning plate receiving a greensheet for punching and in the punch position and in the punched position, respectively.
Figure 3C:
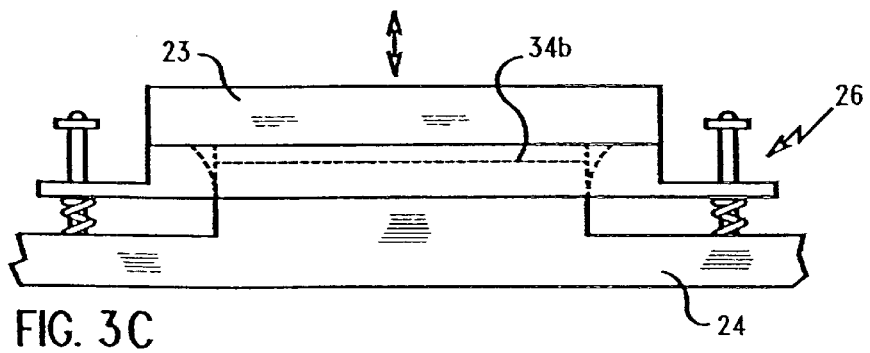

Referring now to FIGS. 3A, 3B and 3C, a greensheet aligner plate is shown generally as 26. The plate 26 will typically be a flat, planar plate, but is shown in a preferred structure as having a planar lower surface 42a and a smaller planar upper surface 42b with recessed side areas 41. Openings 40 allow movably securing the greensheet aligner plate to the die 24 as discussed hereinbelow. The aligner plate 26 has angled sidewalls 44 at through opening 43 acting as a square funnel for accurately positioning the greensheet 34b in the open area 43. A 45° bevel is preferably used.

Referring to FIGS. 3B and 3C, operation of the greensheet aligner plate 26 may be demonstrated. In FIG. 3B, the greensheet aligner plate 26 is shown moveably secured to die 24 using bolts 46 and springs 45. A nut 47 at the end of bolt 46 restrains upward movement of the aligner plate 26. The opening 43 in aligner plate 26 is shown positioned over the upper surface of die 24. A greensheet 34b is shown being positioned by greensheet feeder 35b over the opening 43 and will be urged into alignment by angled sidewalls 44.

Figure 3D:
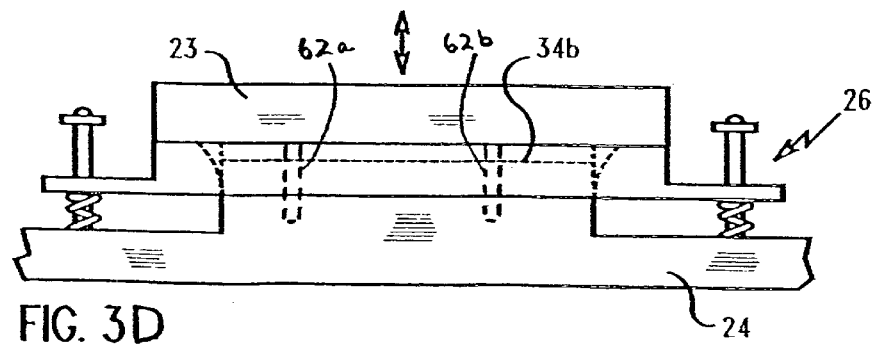

In FIG. 3C, greensheet feeder 35b is shown removed from the punch area and punch 23 positioned on top of the greensheet 34b and ready for punching. The greensheet aligner plate 26 is shown compressed between the punch 23 and the die 24. When the punch is actuated as shown in FIG. 3D, the greensheet 34b will be punched by actuated punch pins 62a and 62b forming the vias in the greensheet. Other punch pins (not shown) which are not actuated remain in the punch 23.

Figure 4:
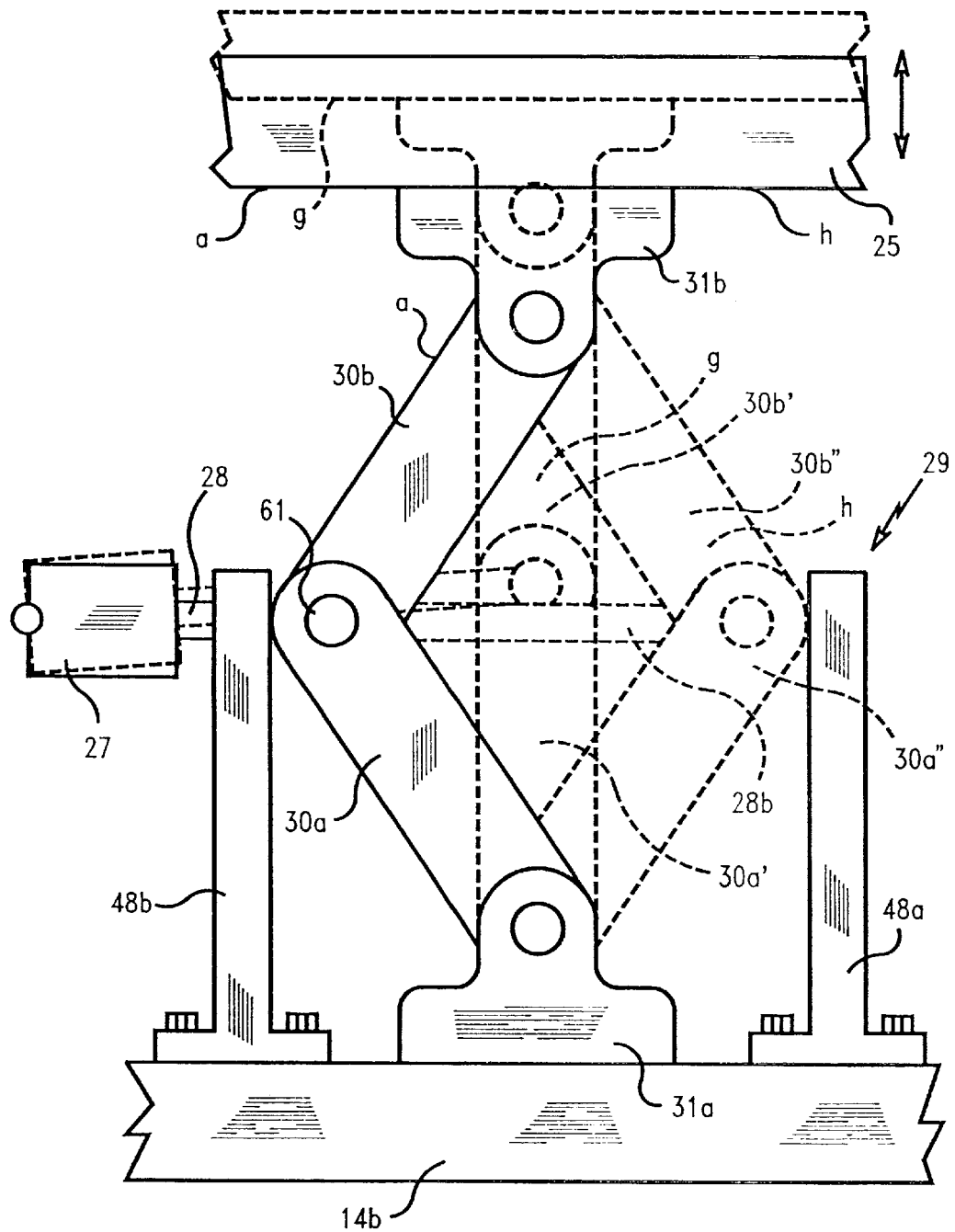
FIG. 4 is a side elevational view of the die moving assembly used in the gang punch assembly apparatus of the invention.

Referring now to FIG. 4, the preferred reciprocating means for moving the die e.g., a die moving knuckle assembly, is shown generally as 29. This assembly moves the die platen 25 upward and downward so that the greensheet within the aligner plate 26 and on the die 24 which is positioned on the die platen 25 will come in contact with the punch 23. The knuckle assembly comprises an upper clevis 31b to which knuckle member 30b is rotably attached at one end. The other end of knuckle member 30b is rotatably attached to knuckle member 30a. The other end of knuckle member 30a is rotably connected to lower clevis 31a which is secured to lower horizontal frame member 14b. The pin 61 at the intersection of knuckle members 30a and 30b is connected to a piston rod 28 which is moved by cylinder 27. As shown in phantom, when piston rod 28 is extended or retracted, the knuckle members 30a and 30b are forced in a different spatial relationship and move upward and downward which likewise moves die platen 25 in an upward and downward motion. Three knuckle positions a, g and h are shown in FIG. 4. In the first position a, piston 28 is retracted in cylinder 27 and the die platen 25 is in a lowered position a. As the rod 28 is extended, the knuckle members 30a and 30b reach vertical position g and die platen 25 and the knuckle members are shown in phantom in a raised position g. As the rod 28 is extended further, the die platen 25 is moved downward to position h which is the same as position a as when the rod is retracted. This motion results in one punch and one retraction stroke for a single stroke of cylinder 27. Structural stop members 48a and 48b are provided to restrict motion of the knuckle members 30a and 30b so that the vertical movement and position of the die platen 25 is limited in its movement.

Figure 6:
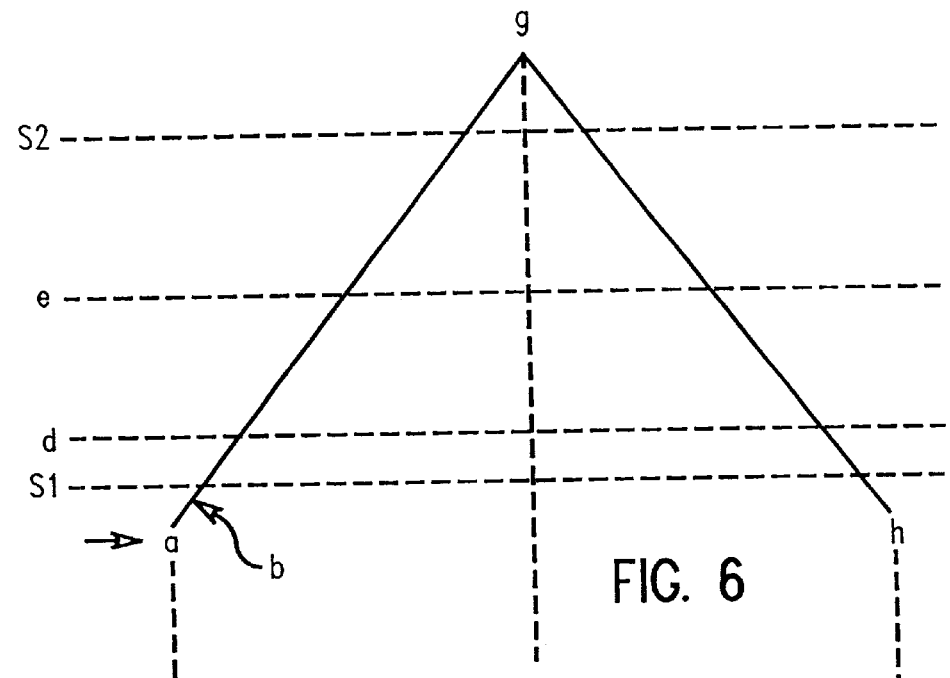
FIG. 6 shows the timing of the pressure chamber control switches as it corresponds to the movement of the punch stroke mechanism.
Figure 5A:
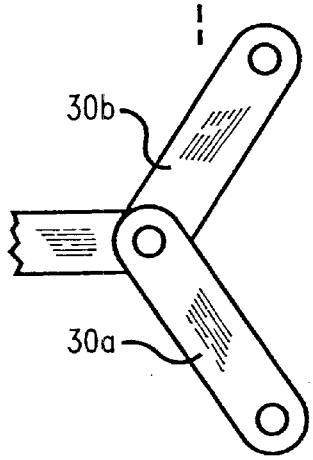
FIGS. 5A–5C show the positions of the die moving assembly during punching of one greensheet.
Figure 5B:
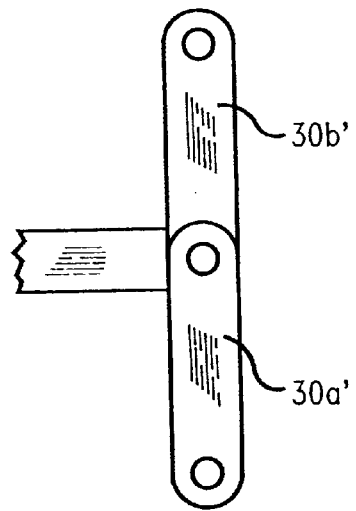
Figure 5C:
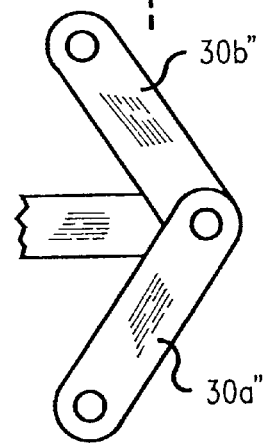

Referring to FIGS. 5A–5C and FIG. 6, the effect of the movement of the rod 28 on the movement of knuckle members 30a and 30b is shown with respect to the position of the die platen 25 and die 24. Line a-g-h of FIG. 6 represents a single punch stroke of the knuckle assembly 29. Point a corresponds to the knuckle linkage when the cylinder 27 rod 28 is retracted as shown in FIG. 5A. Point g corresponds to the knuckle position when the cylinder rod is half way extended and the knuckle members shown as 30a' and 30b' are vertical. Point h corresponds to the knuckle position when the cylinder rod 28 is extended and knuckle members are shown as 30a'' and 30b''. At point a, the punches are fully retracted in the stripper plate of the gang punch.

Figure 7:
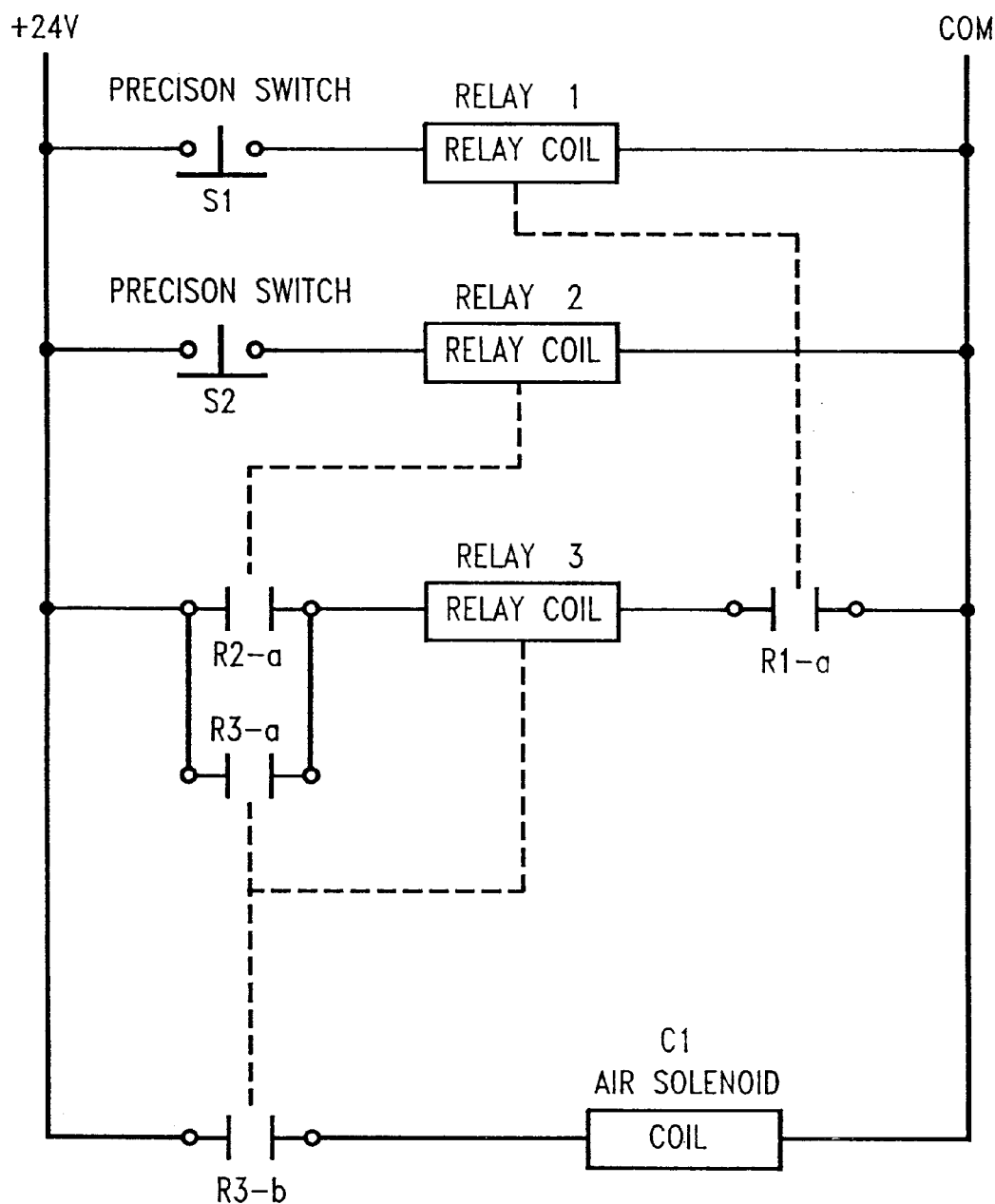
FIG. 7 is a schematic of an electrical circuit to control the air pressure in the air actuated pressure chamber of the gang punch of the tool assembly.

Referring now to FIGS. 6 and 7, as the rod 28 is extended, the knuckle moves upward and switch S1 is closed as the punches touch the greensheet at point d. Relay 1 is picked closing relay closure contacts R1-a. The punches continue through the greensheet and enter the die at point e and continues to travel into the die actuating switch S2. Relay 2 is energized, energizing relay 3 through contacts R2-a whereupon contacts R3-a are closed latching relay 3. Contacts R3-b also close and energize air solenoid coil causing high pressure to be applied to the pressurized air chamber of the punch. The punches are fully extended at point g and begin to retract as the knuckle goes over center toward position h. Air pressure in the pressurized air chamber of the punch prevents the sheet from being lifted as the punches are stripped from the die and greensheet. Switch S2 is opened opening contacts R2-a, but R3 remains energized through latch contacts R3-a. After the punches are fully stripped from the greensheet at point d, switch S1 is opened dropping relay 1 and contacts R1-a. This de-energizes relay 3 opening latch contacts R3-a and pick contacts R3-b de-energizing air solenoid coil C1 removing high pressure from the pressurizable air chamber of the punch. This completes a single punching stroke where a greensheet is punched. The punched greensheet is then removed and another greensheet fed to the punching area. The cylinder is then retracted (i.e., direction h-g-a) and the above sequence of events is repeated. Alternatively, cylinder 28 can be extended and retracted to provide two (2) full punch strokes before the greensheet is removed. This requires only approximately a ½ second of additional time. This improves punched hole quality by reducing debris in the punched holes.

It should be noted that the circuit sequence is independent of movement of the cylinder rod. The switches adjust to punch travel and not knuckle or cylinder or rod travel. The precision microswitch/relay/solenoid control system is independent of the overall tool control computer. This is a fail safe method to protect the punch head from high pressure pressurization when not contacting the sheet which would destroy the punch assembly.

FIG. 7 shows the electrical circuit for the precision switch assembly discussed above.

Referring to FIG. 8, the Precision Switch Actuator pressure controller of the gang punch tool assembly is shown generally as 37. The Precision Switch Activator has a base Si which is secured to the top 12 of the table. The support 51 is in the shape of a U having extended arms to accommodate micrometer heads 55 and 56. The micrometer heads 55 and 56 are used to adjust the actuation point of the precision micrometer switches S1 and S2 of FIGS. 6 and 7. The mechanical dial indicator 52 provides visual readout of the die platen 25 movement. The micrometer heads 55 and 56 are connected to die platen 25 and move upward and downward with die platen 25 during the punching operation. It is in this movement which actuates S1 and S2, associated relay circuit and air solenoid valve coil C1 to control the air flow in the gang punch pressure chamber.

Referring to FIGS. 9A and 9B, 2A and 2B, a preferred embodiment of the punch platen stop assembly 39 is shown. One of two punch platen stop assemblies 39 is shown supported on cross-member 38 which provides a rigid reference point to control the downward movement of the punch platen 18. The stop base 68 has 4 microswitches 60 at the upper surface thereof to the punch platen 18. The stop base 68 has 4 microswitches 60 at the upper surface thereof to sense the hole pattern 150 code (3 of 4 possible holes shown 150a, 150b and 150c) drilled into the bottom of the removable stop block 69. Up to 15 different stop blocks of varying thicknesses are provided to accommodate different sheet thicknesses from 0.002 inch to 0.020 inch thick. This allows the processing of different thickness greensheets by simply changing the stops 69 on each side of the tool. The tool controller checks that the stop 69 code holes 150 correspond to the correct greensheet thickness which is input separately to the computer by the tool operator. Although 4 microswitches are shown, more or less than 4 switches and corresponding code holes may be used to provide a sufficient number of codes for the number of separate stop blocks being used. As described earlier, locking blocks 22a and 22b, automatically adjust to the different thickness stop blocks and provide rigid support to the upper punch platen 18 throughout the punching cycle.

Figure 10:
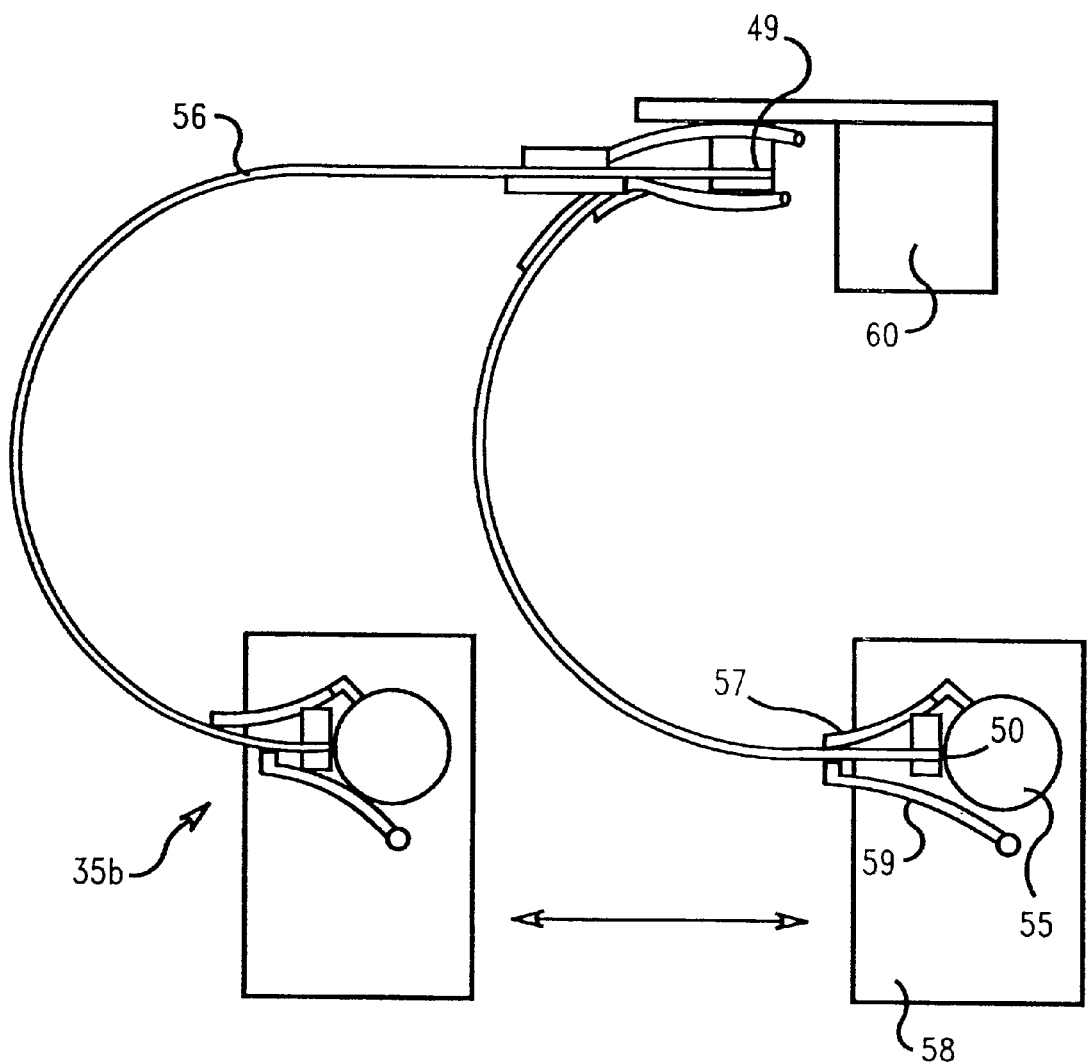
FIG. 10 is a top plan view of a greensheet feeding assembly used in the tool assembly.

Referring to FIG. 10, a schematic illustration of the greensheet feeder mechanism 35b is shown. A similar description would apply to the punched greensheet receiver (removal) mechanism 35a. As shown, the greensheet feeder mechanism 35b comprises an air cylinder 55 supported on a housing base 58. Wires and tubes for air cylinders and vacuum pickup are shown as 57 and 59 and are bound to band 56. Band 56 is secured at one end 50 to housing base 58 and at the other end 49 to band base 60. The band 56 is a compliant material which is rigid in one plane and flexible in the other plane and is in the form of a strip of material such as stainless steel about 2 inch wide by 0.025 inch thick. The band allows for the support of tubes, wire, etc. to the pick up station. The band provides support throughout the range of motion of the pick and place operation without impeding upon the high speed motion of the feeding and removing stages. The band retains the wires and the tubes in the same horizontal plane which is different and distinct from the vertical plane as in assemblies of the prior art. The band is pinned at both ends 49 and 50 to prevent twisting and maintains horizontal support for the wires and tubes without sliding parts thus reducing contamination to the greensheet product below the tubes and wires.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A gang punch tool assembly for forming openings in greensheets comprising:

a punch platen having through openings therein to allow movement of the punch platen vertically along vertically disposed guide rods;

vertically disposed guide rods;

means to move the punch platen vertically downwardly and upwardly along the guide rods;

locking blocks to lock the punch platen in a desired gang punch position;

a gang punch secured to the lower surface of the punch platen having a plurality of actuatable punch pins therein, which when the gang punch is actuated the pins move vertically upwardly and downwardly;

a die platen having through openings therein to allow movement of the die platen vertically along the vertically disposed guide rods;

reciprocating means attached to the lower surface of the die platen for moving the die platen upwardly and downwardly along the guide rods;

a die secured to the upper surface of the die platen, the die having a plurality of openings corresponding to the punch pins in the gang punch;

a greensheet feeder device to feed a greensheet to the die;

a punched greensheet removal device for removing a punched greensheet from the die;

structural means for carrying the punch platen, die platen, guide rods, reciprocating means, greensheet feeder device and punched greensheet removal device;

means to actuate the punch pins in the gang punch to move the punch pins upwardly and downwardly;

wherein when a greensheet is moved from the greensheet feeder device to the die, the gang punch is locked in position by the locking blocks and the gang punch and die are mated, the gang punch is then actuated to force the punch pins downward through the die openings to form openings in the greensheet, the gang punch is then deactuated retracting the punch pins upwardly out of the die and greensheet and the die platen is moved away from the gang punch and the punched greensheet removed by the punched greensheet removal device, with the above steps being repeated to punch the desired number of greensheets.

2. The assembly of claim 1 wherein the locking blocks are wedged shaped and move laterally in the structural means to lock the punch platen in a fixed position in the assembly.

3. The assembly of claim 2 wherein a greensheet alignment device is positioned on top of the die to align therein a greensheet to be punched.

4. The assembly of claim 3 wherein the reciprocating means is a knuckle device comprising one member pivotally attached at one end to the die platen and at the other end pivotally attached to a second member which at the other end of the second member is pivotally attached to the assembly so that when the pivotally joined members are moved, a reciprocating motion to the die platen is provided.

5. The assembly of claim 4 further comprising a punch platen stop means to control the downward movement and height of the punch platen.

6. The assembly of claim 5 wherein the height of the punch platen stop means is adjustable.

7. A gang punch tool assembly for forming openings in greensheets comprising:

- a punch platen having through openings therein to allow movement of the punch platen vertically along vertically disposed guide rods;
- vertically disposed guide rods;
- means to move the punch platen vertically downwardly and upwardly along the guide rods;
- locking blocks to lock the punch platen in a desired gang punch position;
- a gang punch secured to the lower surface of the punch platen having a plurality of actuatable punch pins therein, which when the gang punch is actuated the pins move vertically upwardly and downwardly;
- a die platen having through openings therein to allow movement of the die platen vertically along the vertically disposed guide rods;
- reciprocating means attached to the lower surface of the die platen for moving the die platen upwardly and downwardly along the guide rods;
- a greensheet aligner plate which is vertically moveably secured to the top surface of the die, the plate having a vertical opening with angled side walls for accurately positioning a greensheet in the opening;
- a die secured to the upper surface of the die platen, the die having a plurality of openings corresponding to the punch pins in the gang punch;
- a greensheet feeder device to feed a greensheet to the die;
- a punched greensheet removal device for removing a punched greensheet from the die;
- structural means for carrying the punch platen, die platen, guide rods, reciprocating means, greensheet feeder device and punched greensheet removal device;
- means to actuate the punch pins in the gang punch to move the punch pins upwardly and downwardly;
- wherein when a greensheet is moved from the greensheet feeder device to the greensheet aligner plate on the die, the gang punch is locked in position by the locking blocks and the gang punch and die are mated, the gang punch is then actuated to force the punch pins downward through the die openings to form openings in the greensheet, the gang punch is then deactuated retracting the punch pins upwardly out of the die and greensheet and the die platen is moved away from the gang punch and the punched greensheet removed by the punched greensheet removal device, with the above steps being repeated to punch the desired number of greensheets.

8. The assembly of claim 7 wherein the angled side walls are at about a 45° bevel.

* * * * *

UNITED STATES PATENT AND TRADEMARK OFFICE
CERTIFICATE OF CORRECTION

PATENT NO. : 6,314,852 B1
DATED : November 13, 2001
INVENTOR(S) : Long et al.

It is certified that error appears in the above-identified patent and that said Letters Patent is hereby corrected as shown below:

Column 2,
Line 55, before "5,090,284" insert therefor -- 4,425,829; 5,024,127 --.

Column 3,
Line 66, delete "6223636" and substitute therefor -- 6,223,636 --.

Signed and Sealed this

Sixth Day of August, 2002

*Attest:*

JAMES E. ROGAN
*Attesting Officer*  *Director of the United States Patent and Trademark Office*